United States Patent [19]

Kim

[11] Patent Number: 5,999,023
[45] Date of Patent: Dec. 7, 1999

[54] CLOCK FORWARDING CIRCUIT IN SEMICONDUCTOR INTEGRATED CIRCUIT AND CLOCK FORWARDING METHOD

[75] Inventor: Seok jin Kim, Yongin, Rep. of Korea

[73] Assignee: Samsung Electronics Co., Ltd., Rep. of Korea

[21] Appl. No.: 09/078,940

[22] Filed: May 14, 1998

[30] Foreign Application Priority Data

Dec. 29, 1997 [KR] Rep. of Korea ...................... 97-76390

[51] Int. Cl.$^6$ ...................................................... H03L 7/00
[52] U.S. Cl. ........................................... 327/144; 327/298
[58] Field of Search ..................................... 327/141, 142,
327/143, 144, 145, 146, 150, 154, 155,
159, 162, 163, 165, 166, 291, 292, 298

[56] References Cited

U.S. PATENT DOCUMENTS 5,452,323  9/1995  Rosen ....................................... 375/354

Primary Examiner—Jeffrey Zweizig
Attorney, Agent, or Firm—Lappin & Kusmer LLP

[57] ABSTRACT

A clock forwarding circuit of a semiconductor integrated circuit which increases an operation timing margin of a data receive port and reduces power consumption, and a clock forwarding method, are provided. In the clock forwarding circuit for performing the clock forwarding method, upon abnormal operation of the semiconductor integrated circuit, such as during power-up or initialization, the data receive port captures the amount of interconnection delay of a data line and generates a receive clock signal which is self-generated, from a delayed send clock transmitted from a data send port via the data line. On the other hand, when the circuit operates in a normal operation mode, the data receive port receives data transmitted from the data send port via the data line, in response to the self-generated receive clock. Accordingly, the amount of interconnection delay of the data line is previously captured and data is received in response to the self-generated receive clock. Thus, the operation timing margin of the data receive port is increased. Also, a separate clock line is not required, and the send clock is supplied to the data receive port via the data line only upon abnormal operation of the semiconductor integrated circuit, so that power consumption is reduced.

16 Claims, 3 Drawing Sheets

CLOCK FORWARDING CIRCUIT IN SEMICONDUCTOR INTEGRATED CIRCUIT AND CLOCK FORWARDING METHOD

BACKGROUND OF THE INVENTION

1. Field of the Invention

The present invention relates to a semiconductor integrated circuit, and more particularly, to a clock forwarding circuit in a semiconductor integrated circuit and a clock forwarding method.

2. Description of the Related Art

There are many individual circuits or blocks in an overall semiconductor integrated circuit. Data sending and receiving are carried out among the many blocks. In order to send and receive data, a data line and a clock line are connected between a data send port, i.e., a block for sending data, and a data receive port, i.e., a block for receiving data. However, the data line and the clock line present a load to the associated circuitry which depends on the length, thickness and shape of their conductors. Accordingly, when data and clock signals are transmitted respectively through the data and clock lines, interconnection delay occurs. In particular, when the interconnection delay time on the data line approaches or exceeds the period of a clock input to the data send port and data receive port, malfunction in the form of data errors may occur when data output from the data send port is transmitted to the data receive port through the data line. To prevent this, clock forwarding techniques are used to transmit data from the data send port to the data receive port without having to increase the period of the clock.

FIG. 1 shows a schematic block diagram of a prior art clock forwarding circuit 100. Referring to FIG. 1, the conventional clock forwarding circuit 100 includes a data sending latch 101, a clock sending latch 103, a data driver 105, a clock driver 107, a data line 109, a clock line 111, a clock generator 113, a first data receiving latch 115, a second data receiving latch 117, a selector 119, a third data receiving latch 121 and an unload control circuit 123. The data sending latch 101 and the clock sending latch 103 are included in a data receive port 102; and the clock generator 113, the first, second and third data receiving latches 115, 117 and 121, the selector 119 and the unload control circuit 123 are included in a data receive port 104.

In the prior art circuit of FIG. 1, the data being sent, in the form of a signal DATA, is applied to the data input line of the data sending latch 101; and the clock signal SCLK is applied to the clock inputs of the data sending latch 101 and the clock sending latch 103. The SCLK signal causes the DATA applied to latch 101 to appear at the Q output of latch 101. The SCLK signal is also frequency divided by latch 103 and appears at half its original frequency at the Q output of latch 103. The data signal is driven across data line 109 by data driver 105, and the frequency-divided SCLK signal is driven across clock line 111 by clock driver 107.

At the data receive port 104, the data signal on the data line 109 is applied to the data inputs of the two data receiving latches 115 and 117. The clock generator circuit 113 receives the frequency-divided SCLK signal and sends an in-phase version of the divided signal to the clock input of latch 115 and an inverted version of the clock signal to the clock input of latch 117. The latches 115 and 117 serve to restore the original clock frequency of the SCLK signal. Assuming that the latches 115 and 117 are forward-edge triggered, on the forward edge of the divided signal, the data is clocked through latch 115 to the selector 119. On the negative-going edge of the clock signal, data is clocked through latch 117 to the selector 119.

The unload control circuit 123 is used to control the selector 119 to select one of the data outputs from latch 115 or 117 in response to a target clock signal TCLK. The selected output is forwarded to the data input of the third data receive latch 121 in accordance with the timing of the TCLK signal. On the positive-going edge of the TCLK signal, the data selected by selector 119 appears at the Q output of latch 121 as the RDATA signal.

In the conventional clock forwarding circuit 100, interconnection delay time occurring on the data line 109 must be almost the same as interconnection delay time occurring on the clock line 111. Thus, the conductor of the data line 109 and the conductor of the clock line 111 must be designed and manufactured to have the same load. This places a very serious restriction on the design of the overall circuit, since the data line 109 and clock line 111 need to be designed to have the same length and thickness and must have similar proximal circuitry such that reactive impedances are similar.

In the conventional clock forwarding circuit 100, when the load of the data line 109 is different from that of the clock line 111, the interconnection delay of the data line 109 becomes different from the interconnection delay of the clock line 111. This reduces an operation timing margin of the data receive port 104. The clock signal SCLK is continuously generated and supplied to the data receive port 104 via the clock line 111 to synchronize data transfer. This tends to increase power consumption of the circuit.

SUMMARY OF THE INVENTION

To solve the above problems, an objective of the present invention is to provide a clock forwarding circuit in a semiconductor integrated circuit, which increases the operation timing margin of a data receive port and decreases power consumption.

Another objective of the present invention is to provide a method of clock forwarding in a semiconductor integrated circuit, by which the operation timing margin of the data receive port is increased and power consumption is reduced.

Accordingly, to achieve the first objective, there is provided a clock forwarding circuit of a semiconductor integrated circuit comprising a data sending latch, a selector, a data line, a distributor, a clock generator and a data receiving latch.

The data sending latch latches data in response to a send clock. The selector selects either the send clock or the output of the data sending latch, in response to a control signal. The data line transmits the output of the selector. The distributor distributes delayed data and a delayed send clock transmitted via the data line, in response to the control signal. The clock generator receives a target clock and the delayed send clock output by the distributor and generates a receive clock. The data receiving latch latches the delayed data output by the distributor in response to the receive clock.

The control signal indicates abnormal or normal operation of the semiconductor integrated circuit. That is, the control signal indicates either normal operation or operation of the circuit under abnormal or special conditions, such as at power-on or system initialization. The selector selects and outputs the send clock when the semiconductor integrated circuit operates in an abnormal or special mode and selects and outputs the output of the data sending latch when the semiconductor integrated circuit operates normally. The distributor outputs the delayed send clock transmitted via the data line to the clock generator when the semiconductor integrated circuit operates abnormally and outputs the delayed data transmitted via the data line to the data receiving latch when the semiconductor integrated circuit operates normally.

To achieve the second objective, there is provided a method of clock forwarding in a semiconductor integrated circuit, comprising the steps of: latching data in response to a send clock; outputting the send clock to a data line when the semiconductor integrated circuit operates abnormally; receiving a target clock and a delayed send clock transmitted via the data line and generating a receive clock; outputting the latched data to the data line when the semiconductor integrated circuit operates normally; and latching delayed data transmitted via the data line in response to the receive clock.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
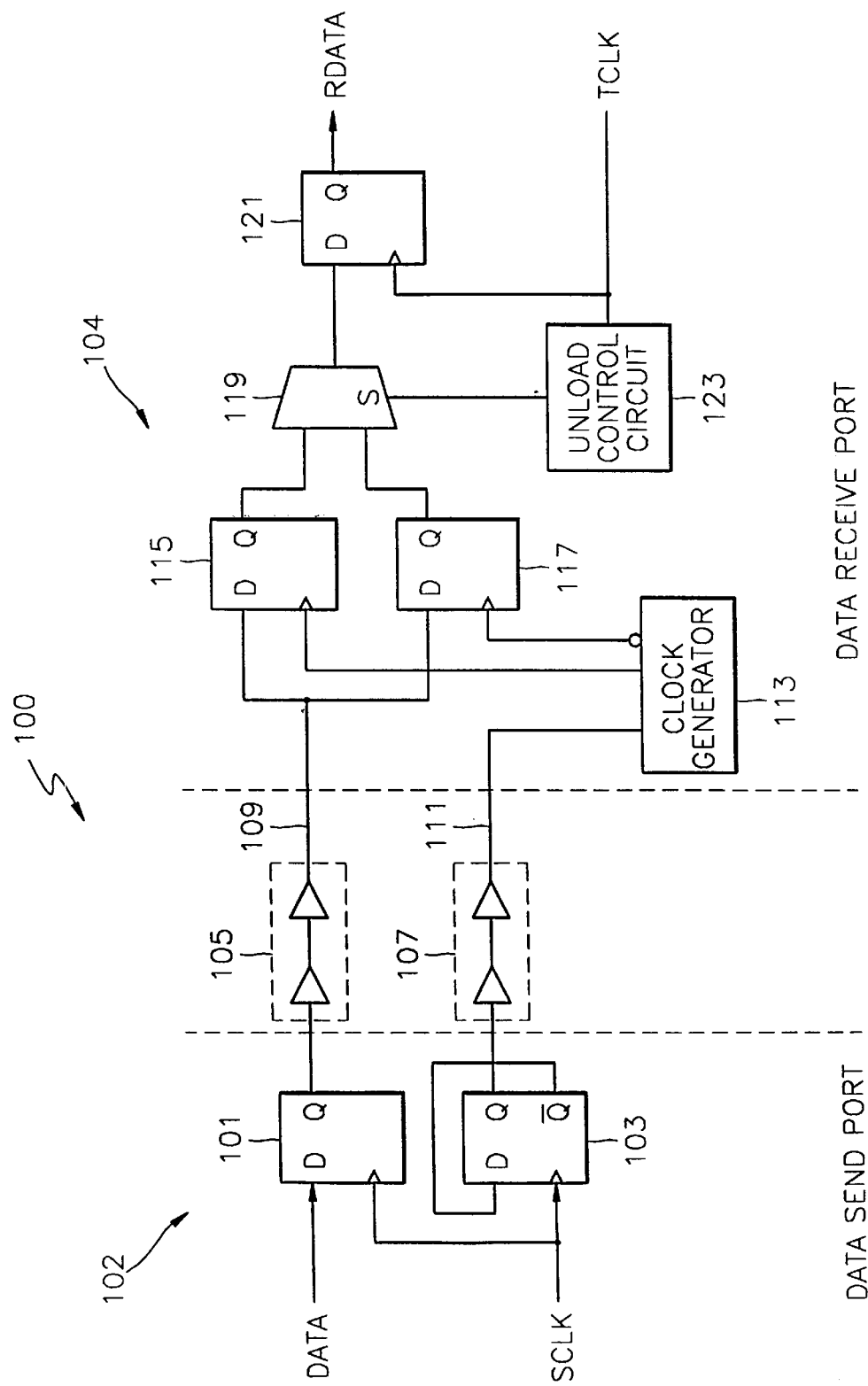
FIG. 1 is a schematic circuit diagram illustrating a prior art clock forwarding circuit.
Figure 2:
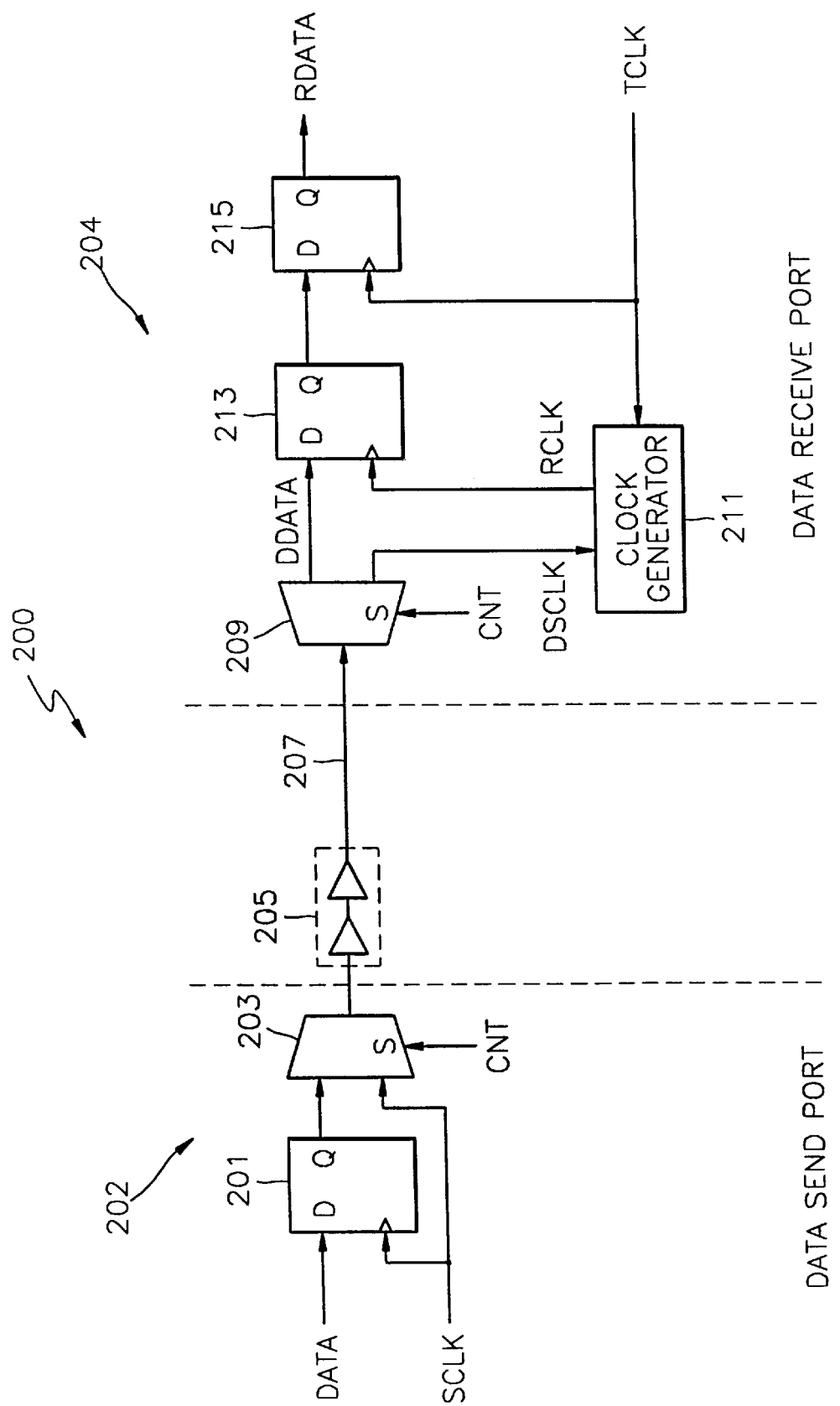
FIG. 2 is a schematic circuit diagram illustrating a preferred embodiment of a clock forwarding circuit according to the present invention.

Referring to FIG. 2, a clock forwarding circuit 200 according to the present invention includes a data sending latch 201, a selector 203, a driver 205, a data line 207, a distributor 209, a clock generator 211, a first data receiving latch 213 and a second data receiving latch 215. The data sending latch 201 and the selector 203 are included in a data send port 202, and the distributor 209, the clock generator 211 and the first and second data receiving latches 213 and 215 are included in a data receive port 204.

The data sending latch 201 latches data DATA in response to a send clock SCLK. The selector 203, which can include a multiplexer, selects either the send clock SCLK or the output of the data sending latch 201, in response to a control signal CNT indicating an abnormal or normal operation of the semiconductor integrated circuit in which the circuit 200 of the invention operates. The data line 207 transmits the output of the selector 203. The driver 205 is connected between the selector 203 and the data line 207 as needed, and receives the output of the selector 203 and drives the data line 207. The distributor 209, which can include a demultiplexer, distributes a delayed send clock DSCLK and delayed data DDATA transmitted via the data line 207, in response to the control signal CNT. The delayed send clock DSCLK is the result of delaying the send clock SCLK on the data line 207. The delayed data DDATA is the result of delaying the data DATA on the data line 207. The clock generator 211 receives the delayed send clock DSCLK output from the distributor 209 and generates a receive clock RCLK. The first data receiving latch 213 latches the delayed data DDATA output from the distributor 209, in response to the receive clock RCLK. The second data receiving latch 215 latches the output of the first data receiving latch 213 in response to the target clock TCLK and outputs the result as received data RDATA.

Figure 3:
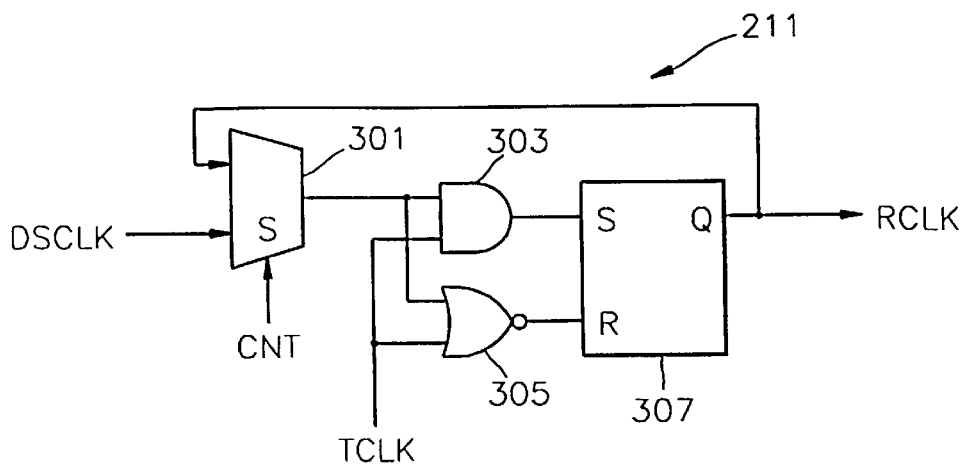
FIG. 3 is a detailed schematic circuit diagram illustrating one embodiment of the clock generator shown in FIG. 2.

FIG. 3 is a detailed circuit diagram of one embodiment of the clock generator 211 shown in FIG. 2. Referring to FIG. 3, the clock generator 211 includes a selector 301, an AND gate 303, a NOR gate 305 and a set-reset flip-flop 307.

The selector 301, which can include a multiplexer, selects either the delayed send clock DSCLK or the fed back receive clock RCLK in response to the control signal CNT. The AND gate 303 performs an AND operation on the output of the selector 301 and the target clock TCLK. The NOR gate 305 performs an OR operation on the output of the selector 301 and the target clock TCLK, and inverts the result. The set-reset flip-flop 307 receives the outputs of the AND gate 303 and the NOR gate 305 and generates the receive clock RCLK therefrom. The receive clock RCLK is a continuously self-generated signal.

In more detail, the clock generator 211 captures the amount of the interconnection delay of the data line 207 and generates the receive clock RCLK, during abnormal operation. Also, the clock generator has the condition that the amount of the interconnection delay of the data line 207, referred to herein as $\Delta(int)$, is greater than the amount of skew between the send clock SCLK and the delayed send clock DSCLK, referred to herein as $\Delta(skew)$. When $\Delta(int)$ is smaller than $\Delta(skew)$, an inversion of the delayed send clock DSCLK is input to the selector 301.

Figure 4:
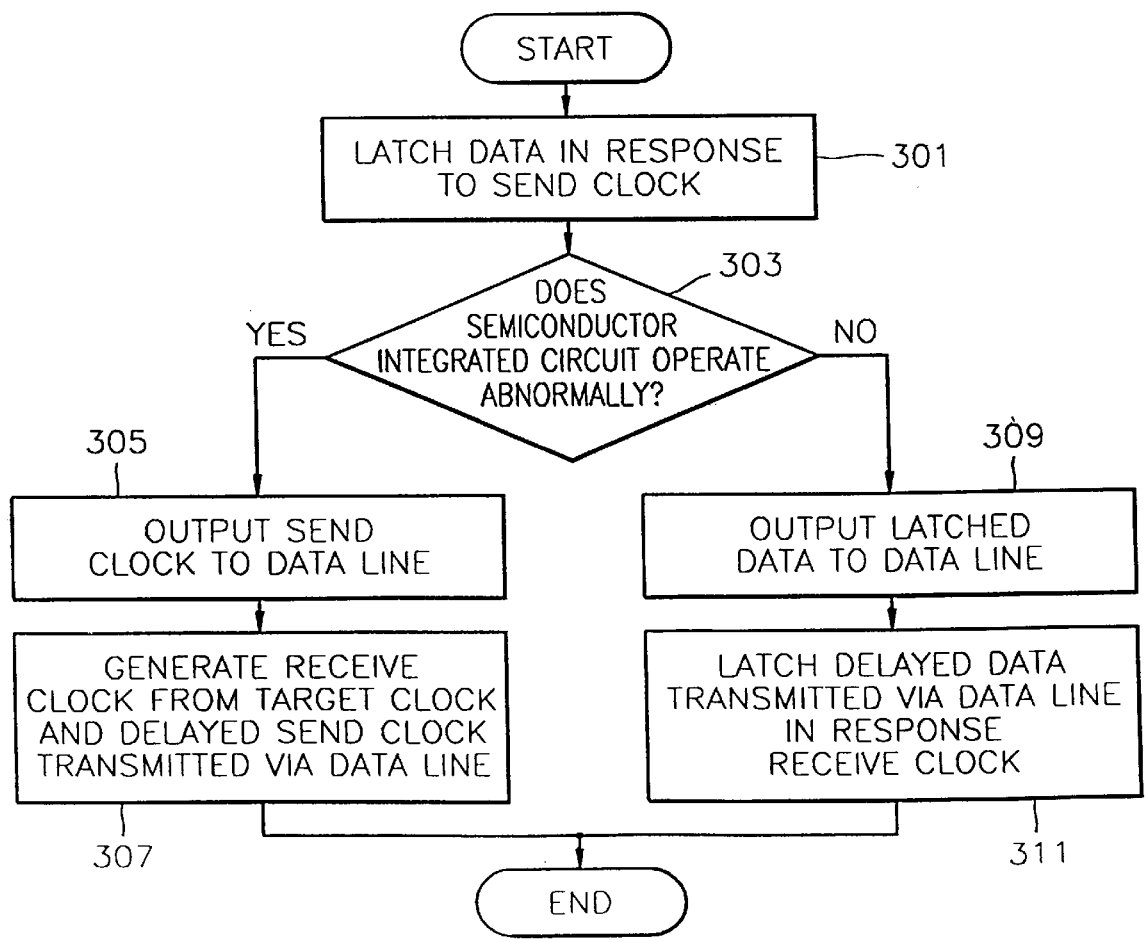
FIG. 4 is a flowchart illustrating a clock forwarding method according to the present invention which can be performed in the circuit shown in FIG. 2.

FIG. 4 is a flowchart illustrating a clock forwarding method according to the present invention, which can be performed in the circuit 200 shown in FIG. 2. Referring to FIG. 4, according to the clock forwarding method, first, data is latched in response to a send clock in step 301. During abnormal or special operation of the semiconductor integrated circuit, such as during power-up or initialization, the send clock is output to the data line 207, and a receive clock is generated from a target clock and a delayed send clock transmitted via the data line, in steps 303, 305 and 307. When the semiconductor integrated circuit operates normally, the latched data is output to the data line, and the delayed data transmitted via the data line is latched in response to the receive clock, in steps 309 and 311.

The operation of the clock forwarding circuit and the clock forwarding method according to the present invention will now be described in more detail, referring to FIGS. 2 and 4. First, the data sending latch 201 latches the data signal DATA in response to the send clock SCLK, in step 301. When the semiconductor integrated circuit operates abnormally, or under special circumstances, e.g., upon power-up or upon initialization, the selector 203 selects the send clock SCLK in response to the control signal CNT and outputs the result to the data line 207, in steps 303 and 305. Here, if the driver 205 is connected between the selector 203 and the data line 207, the driver 205 receives the send clock SCLK, i.e., the output of the selector 203, and drives the data line 207. After the step 305, the distributor 209 outputs the delayed send clock DSCLK transmitted via the data line 207, in response to the control signal CNT. The clock generator 211 receives the target clock TCLK and the delayed send clock DSCLK and generates a receive clock RCLK, in step 307.

When the semiconductor integrated circuit operates normally, the selector 203 selects data latched by the data sending latch 201, in response to the control signal CNT, and outputs the selected data to the data line 207, in step 309. Here, if the driver 205 is connected between the selector 203 and the data line 207, the driver 205 receives the latched data, i.e., the output of the selector 203, and drives the data line 207. After the step 309, the distributor 209 outputs the delayed data DDATA transmitted via the data line 207, in response to the control signal CNT, and the first data receiving latch 213 latches the delayed data DDATA in response to the receive clock RCLK, in step 311. Thereafter, the second data receiving latch 215 latches the output of the first data receiving latch 213 in response to the target clock TCLK, and outputs the result as received data RDATA.

As a result, in the clock forwarding circuit for performing the aforementioned clock forwarding method according to the present invention, the data receive port captures the amount of the interconnection delay of the data line and generates the receive clock which is self-generated, from the delayed send clock transmitted from the data send port via the data line. This operation is performed upon abnormal operation of the semiconductor integrated circuit. On the other hand, upon normal operation thereof, the data receive port receives data transmitted from the data send port via the data line, in response to the self-generated receive clock.

Once again, in the clock forwarding circuit for performing the clock forwarding method according to the present invention, the amount of the interconnection delay of the data line is captured and data is received in response to the self-generated receive clock. Thus, the operation timing margin of the data receive port is increased. Also, the clock line is removed, and the send clock is supplied to the data receive port via the data line only upon abnormal operation of the semiconductor integrated circuit, so that power consumption is reduced.

As above, the present invention was described referring to the one embodiment, but it is not limited thereto. It is apparent that various modifications may be effected within the spirit of the present invention by those skilled in the art.

What is claimed is:

1. A clock forwarding circuit of a semiconductor integrated circuit, comprising:

a data sending latch for latching data in response to a send clock;

a selector for selecting either the send clock or the output of the data sending latch, in response to a control signal;

a data line for transmitting the output of the selector;

a distributor for distributing delayed data and a delayed send clock transmitted via the data line, in response to the control signal;

a clock generator for receiving a target clock and the delayed send clock output by the distributor and generating a receive clock; and a data receiving latch for latching the delayed data output by the distributor in response to the receive clock.

2. The clock forwarding circuit as claimed in claim 1, further comprising a driver connected between the selector and the data line, for receiving the output of the selector and driving the data line.

3. The clock forwarding circuit as claimed in claim 1, further comprising another data receiving latch for latching the output of the data receiving latch in response to the target clock.

4. The clock forwarding circuit as claimed in claim 1, wherein the control signal indicates abnormal or normal operation of the semiconductor integrated circuit.

5. The clock forwarding circuit as claimed in claim 1, wherein:

the selector selects and outputs the output of the data sending latch when the semiconductor integrated circuit operates in a normal operational mode; and the selector selects and outputs the send clock when the semiconductor integrated circuit operates in an abnormal operational mode.

6. The clock forwarding circuit as claimed in claim 5, wherein the abnormal operation mode is a power-up mode.

7. The clock forwarding circuit as claimed in claim 5, wherein the abnormal operational mode is an initialization mode.

8. The clock forwarding circuit as claimed in claim 1, wherein:

the distributor outputs the delayed data transmitted via the data line to the data receiving latch when the semiconductor integrated circuit operates in a normal operational mode; and the distributor outputs the delayed send clock transmitted via the data line to the clock generator when the semiconductor integrated circuit operates in an abnormal operational mode.

9. The clock forwarding circuit as claimed in claim 8, wherein the abnormal operational mode is a power-up mode.

10. The clock forwarding circuit as claimed in claim 8, wherein the abnormal operational mode is an initialization mode.

11. The clock forwarding circuit as claimed in claim 1, wherein the clock generator comprises:

a selector for selecting either the delayed send clock or the receive clock in response to the control signal;

an AND gate for performing an AND operation on the output of the selector and the target clock;

a NOR gate for performing a NOR operation on the output of the selector and the target clock; and a set-reset flip-flop for receiving the outputs of the AND gate and the NOR gate and generating the receive clock.

12. A method of clock forwarding in a semiconductor integrated circuit, comprising the steps of:

(a) latching data in response to a send clock;

(b) outputting the send clock to a data line when the semiconductor integrated circuit operates in an abnormal operational mode;

(c) receiving a target clock and a delayed send clock transmitted via the data line, and generating a receive clock therefrom;

(d) outputting the latched data to the data line when the semiconductor integrated circuit operates in a normal operational mode; and (e) latching delayed data transmitted via the data line in response to the receive clock.

13. The clock forwarding method as claimed in claim 12, wherein the abnormal operational mode is a power-up mode.

14. The clock forwarding method as claimed in claim 12, wherein the abnormal operational mode is a initialization mode.

15. The clock forwarding method as claimed in claim 12, further comprising the steps of:

between steps (b) and (c), applying the send clock output on the data line to a driver to drive the data line; and between steps (d) and (e), applying the data output on the data line to the driver to drive the data line.

16. The clock forwarding method as claimed in claim 12, further comprising, after step (e), in response to the target clock, again latching the data that was previously latched in step (e).

* * * * *